(12) United States Patent
Gung et al.

(10) Patent No.: US 8,871,064 B2
(45) Date of Patent: *Oct. 28, 2014

(54) ELECTROMAGNET ARRAY IN A SPUTTER REACTOR

(75) Inventors: Tza-Jing Gung, San Jose, CA (US); Xinyu Fu, Fremont, CA (US); Arvind Sundarrajan, San Jose, CA (US); Edward P. Hammond, IV, Hillsborough, CA (US); Praburam Gopalraja, San Jose, CA (US); John C. Forster, San Francisco, CA (US); Mark A. Perrin, San Jose, CA (US); Andrew S. Gillard, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1303 days.

This patent is subject to a terminal disclaimer.

(21) Appl. No.: 12/695,643

(22) Filed: Jan. 28, 2010

(65) Prior Publication Data

US 2010/0155223 A1      Jun. 24, 2010

Related U.S. Application Data

(60) Division of application No. 11/119,350, filed on Apr. 29, 2005, now Pat. No. 7,686,926, which is a
(Continued)

(51) Int. Cl.
*C23C 14/34*      (2006.01)
*H01J 37/32*      (2006.01)
(Continued)

(52) U.S. Cl.
CPC .......... *H01J 37/3266* (2013.01); *C23C 14/358* (2013.01); *H01J 37/32688* (2013.01); *C23C 14/046* (2013.01); *H01L 21/76865* (2013.01); *H01J 37/3408* (2013.01); *C23C 14/165*
(Continued)

(58) Field of Classification Search
CPC . H01J 37/345; H01J 37/3458; H01J 37/3266; H01J 37/32669; C23C 14/34; C23C 14/35
USPC ................. 204/298.16, 192.1, 192.12, 298.19
See application file for complete search history.

(56) References Cited

U.S. PATENT DOCUMENTS

| 4,624,767 A | 11/1986 | Obinata |
| 4,911,814 A | 3/1990 | Matsuoka et al. |

(Continued)

FOREIGN PATENT DOCUMENTS

| JP | 2-224239 A | 9/1990 |
| JP | H05-106051 A | 4/1993 |
| JP | 2001-110597 A | 4/2001 |

*Primary Examiner* — John Brayton
(74) *Attorney, Agent, or Firm* — Charles S. Guenzewr

(57) ABSTRACT

A multi-step process performed in a plasma sputter chamber including sputter deposition from the target and argon sputter etching of the substrate. The chamber includes a quadruple electromagnetic coil array coaxially arranged in a rectangular array about a chamber axis outside the sidewalls of a plasma sputter reactor in back of an RF coil within the chamber. The coil currents can be separately controlled to produce different magnetic field distributions, for example, between a sputter deposition mode in which the sputter target is powered to sputter target material onto a wafer and a sputter etch mode in which the RF coil supports the argon sputtering plasma. A TaN/Ta barrier is first sputter deposited with high target power and wafer bias. Argon etching is performed with even higher wafer bias. A flash step is applied with reduced target power and wafer bias.

6 Claims, 12 Drawing Sheets

Related U.S. Application Data continuation-in-part of application No. 10/950,349, filed on Sep. 23, 2004, now Pat. No. 7,527,713.

(60) Provisional application No. 60/574,905, filed on May 26, 2004.

(51) Int. Cl.
- *C23C 14/35* (2006.01)
- *C23C 14/04* (2006.01)
- *H01L 21/768* (2006.01)
- *H01J 37/34* (2006.01)
- *C23C 14/16* (2006.01)
- *H01L 21/285* (2006.01)
- *C23F 4/00* (2006.01)
- *C23C 14/06* (2006.01)

(52) U.S. Cl.
CPC .. (2013.01); *H01J 37/32623* (2013.01); *H01L 21/76844* (2013.01); *H01L 21/76846* (2013.01); *H01L 21/2855* (2013.01); *C23F 4/00* (2013.01); *C23C 14/0641* (2013.01); *H01J 37/321* (2013.01)
USPC .............. 204/192.1; 204/298.16; 204/192.12; 204/298.19

(56) References Cited

U.S. PATENT DOCUMENTS

| | | | |
|---|---|---|---|
| 4,963,242 A | 10/1990 | Sato et al. | |
| 4,990,229 A | 2/1991 | Campbell et al. | |
| 5,122,251 A | 6/1992 | Campbell et al. | |
| 5,198,725 A | 3/1993 | Chen et al. | |
| 5,208,512 A | 5/1993 | Forster et al. | |
| 5,312,778 A | 5/1994 | Collins et al. | |
| 5,429,070 A | 7/1995 | Campbell et al. | |
| 5,556,501 A | 9/1996 | Collins et al. | |
| 5,662,819 A | 9/1997 | Kadomura | |
| 5,674,321 A * | 10/1997 | Pu et al. | 118/723 MR |
| 5,680,014 A | 10/1997 | Miyamoto et al. | |
| 5,688,382 A * | 11/1997 | Besen et al. | 204/192.12 |
| 5,744,011 A | 4/1998 | Okubo et al. | |
| 5,824,607 A | 10/1998 | Trow et al. | |
| 5,897,923 A | 4/1999 | Tamura et al. | |
| 5,944,968 A | 8/1999 | Kobayshi et al. | |
| 6,054,016 A | 4/2000 | Tuda et al. | |
| 6,080,285 A | 6/2000 | Liu et al. | |
| 6,228,236 B1 | 5/2001 | Rosenstein et al. | |
| 6,238,528 B1 | 5/2001 | Xu et al. | |
| 6,297,595 B1 | 10/2001 | Stimson et al. | |
| 6,320,320 B1 | 11/2001 | Bailey et al. | |
| 6,341,574 B1 | 1/2002 | Bailey et al. | |
| 6,350,353 B2 | 2/2002 | Golparaja et al. | |
| 6,352,629 B1 | 3/2002 | Wang | |
| 6,368,469 B1 | 4/2002 | Nulman et al. | |
| 6,392,187 B1 | 5/2002 | Johnson | |
| 6,463,873 B1 | 10/2002 | Thwaites | |
| 6,514,390 B1 | 2/2003 | Xu et al. | |
| 6,599,399 B2 | 7/2003 | Xu | |
| 6,730,196 B2 | 5/2004 | Wang et al. | |
| 6,744,213 B2 | 6/2004 | Wilcoxson et al. | |
| 6,887,786 B2 | 5/2005 | Zhang et al. | |
| 7,527,713 B2 | 5/2009 | Gung et al. | |
| 2003/0116427 A1 | 6/2003 | Ding et al. | |

\* cited by examiner

ELECTROMAGNET ARRAY IN A SPUTTER REACTOR

RELATED APPLICATION

This application is a division of Ser. No. 11/119,350, filed Apr. 29, 2005, now issued as U.S. Pat. No. 6,686,926, which is a continuation in part of Ser. No. 10/950,349, filed Sep. 23, 2004 and now issued as U.S. Pat. No. 7,527,713, which claims benefit of U.S. provisional application 60/574,905, filed May 26, 2004.

FIELD OF THE INVENTION

The invention relates generally to plasma processing of substrates. In particular, the relates to the RF coils and auxiliary magnets, for example, electromagnets used in a sputter reactor, most particularly in a multi-step process.

BACKGROUND ART

Sputtering, alternatively called physical vapor deposition (PVD), is used to deposit several different layers of metals and related materials in the fabrication of semiconductor integrated circuits. In one demanding application, a thin barrier layer is sputtered onto the walls and bottom of a narrow hole etched into and often through an inter-level dielectric layer, most typically composed of silicon oxide or similar oxide materials. The remainder of the hole is then filled with a metal to serve an electrical connection either vertically in a via penetrating the dielectric layer or horizontally in a trench interconnect formed in the surface of the dielectric layer. The barrier layer prevents diffusion between the metal and the oxide dielectric and thereby prevents oxygen from degrading the metal conductivity and metal from decreasing the resistivity of the dielectric.

In advanced integrated circuits, copper is increasingly used as the metallization material because of its high conductivity and low electromigration. Various barrier materials have been proposed for copper metallization. The most common barrier materials are based upon tantalum, typically in the form of a TaN/Ta bilayer with a TaN layer providing adhesion to the oxide and a Ta layer providing a wetting layer for the copper deposited on it. A magnetron sputter reactor 10 illustrated schematically in cross section in FIG. 1 can effectively sputter thin films of Ta and TaN into holes having high aspect ratios and can further act to plasma clean the substrate and selectively etch portions of the deposited tantalum-based films. The reactor 10 includes a vacuum chamber 12 arranged generally symmetrically about a central axis 14. A vacuum pump system 14 pumps the chamber 12 to a very low base pressure in the range of $10^{-6}$ Torr. However, a gas source 18 connected to the chamber through a mass flow controller 20 supplies argon as a sputter working gas. The argon pressure inside the chamber 12 is typically held in the low milliTorr range. A second gas source 22 supplies nitrogen gas into the chamber through another mass flow controller 24 when tantalum nitride is being deposited.

A pedestal 30 arranged about the central axis 14 holds a wafer 32 or other substrate to be sputter coated. An unillustrated clamp ring or electrostatic chuck may be used to hold the wafer 32 to the pedestal 30. An RF power supply 34 is connected to the pedestal 30, which is conductive and act as an electrode, through a capacitive coupling circuit 36. In the presence of a plasma, the RF biased pedestal 30 develops a negative DC bias, which is effective at attracting and accelerating positive ions in the plasma. An electrically grounded shield 36 protects the chamber walls and the sides of the pedestal 30 from sputter deposition. A target 38 is arranged in opposition to the pedestal 30 and is vacuum sealed to the chamber 12 through an isolator 40. At least the front surface of the target 38 is composed of a metallic material to be deposited on the wafer 32, in this case, tantalum.

A DC power supply 42 electrically biases the target 38 to a negative voltage with respect to the grounded shield 36 to cause the argon to discharge into a plasma such that the positively charged argon ions are attracted to the negatively biased target 38 and sputter tantalum from it, some of which falls upon the wafer 32 and deposits a layer of the tantalum target material on it. In reactive sputtering, reactive nitrogen gas is additionally admitted from the nitrogen source 18 into the chamber 12 to react with the tantalum being sputtered to cause the deposition of a tantalum nitride layer on the wafer 32.

The reactor 10 additionally includes an inductive coil 46, preferably having one wide turn wrapped around the central axis 14 just inside of the grounded shield 26 and positioned above the pedestal 30 approximately one-third of the distance to the target 38. The coil 46 is supported on the grounded shield 26 or another inner tubular shield but electrically isolated therefrom, and an electrical lead penetrates the sidewalls of the shield 26 and chamber 12 to power the coil 46. Preferably, the coil 46 is composed of the same barrier material as the target 38. An RF power supply 48 applies RF current to the coil 46 to induce an axial RF magnetic field within the chamber and hence generate an azimuthal RF electric field that is very effective at coupling power into the plasma and increasing its density. The inductively coupled RF power may be used as the primary plasma power source when the target power is turned off and the sputter reactor is being used to etch the wafer 32 with argon ions or for other purposes. The inductively coupled RF power may alternatively act to increase the density of the plasma extending to the target 38.

The coil 46 may be relatively wide and be composed of tantalum to act as a secondary sputtering target under the proper conditions.

The target sputtering rate and sputter ionization fraction of the sputtered atoms can be greatly increased by placing a magnetron 50 is back of the target 38. The magnetron 50 preferably is small, strong, and unbalanced. The smallness and strength increase the ionization ratio and the imbalance projects a magnet field into the processing region for at least two effects of guiding sputtered ions to the wafer and reducing plasma loss to the walls. Such a magnetron includes an inner pole 52 of one magnetic polarity along the central axis and an outer pole 54 which surrounds the inner pole 52 and has the opposite magnetic polarity. The magnetic field extending between the poles 52, 54 in front of the target 38 creates a high-density plasma region 56 adjacent the front face of the target 46, which greatly increases the sputtering rate. The magnetron 50 is unbalanced in the sense that the total magnetic intensity of the outer pole 54, that is, the magnetic flux integrated over its area, is substantially greater than that of the inner pole, for example, by a factor of two or more. The unbalanced magnetic field projects from the target 38 toward the wafer 32 to extend the plasma and to guide sputtered ions to the wafer 32 and reduce plasma diffusion to the sides. To provide a more uniform target sputtering pattern, the magnetron 40 is typically formed in a triangular shape that is asymmetrical about the central axis 14, but a motor 60 drives a rotary shaft 62 extending along the central axis 14 and fixed to a plate 66 supporting the magnetic poles 52, 54 to rotate the magnetron 40 about the central axis 40 and produce an azimuthally uniform time-averaged magnetic field. If the magnetic poles 52, 54 are formed by respective arrays of opposed cylindrical permanent magnets, the plate 66 is advantageously formed of a magnetic material such as magnetically soft stainless steel to serve as a magnetic yoke. Magnetron systems are known in which the radial position of the magnetron can be varied between different phases of the sputtering process and chamber cleaning as described by Gung et al. in U.S. patent application Ser. No. 10/949,635, filed Sep. 23, 2004, incorporated herein by reference in its entirety.

Sputtering tantalum into high aspect-ratio holes requires careful control of the sputtering conditions to balance deposition uniformity over the entire wafer and to achieve good sidewall coverage for both Ta and TaN without etching the top planar surface. The via bottom preferably is left uncoated in vias to provide copper contact between layers while trench bottoms need to remain coated. There are three active species in the sputtering process, neutral tantalum $Ta^0$, tantalum ions $Ta^+$, and argon ions $Ar^+$. Their flux distribution across the wafer in the absence of wafer biasing is shown by plots A, B, C in FIGS. 2, 3, and 4. All these profiles are heavy in the center and light on the edges because of geometric effects arising from the finite spacing between the wafer and the moderately sized target and also because of the tendency of plasma ions to diffuse to the central region of low magnetic field. In the absence of wafer biasing, the net tantalum deposition profile shown in FIG. 5 is the sum A+B of the two tantalum profiles. The center peak can be suppressed somewhat by forming the magnetron to cause heavy sputtering near the target edge. However, this approach causes the sputtered tantalum flux to have a large horizontal velocity component towards the wafer center. The radial particle asymmetry produces an asymmetry between the opposed sidewalls of the hole being coated. Alternatively, wafer biasing can be used to improve the radial deposition uniformity. In particular, the wafer biasing can be optimized to cause the argon ions to partially etch the depositing tantalum. Since the argon profile is also center peaked, the tantalum etching is also stronger at the center. The optimized net tantalum deposition, shown by the profile in FIG. 5, is the sum of $A+B-\alpha C$, where $\alpha$ depends upon biasing. The profile is not completely uniform but the deposition at the center can be decreased to nearly equal deposition at the edge. If wafer biasing is further increased, the resultant profile shown in FIG. 7 shows a heavy edge deposition relative to a light center deposition, which is considered worse than the profile of FIG. 6.

Bias optimization by itself has the difficulty that the process window is relatively narrow. Even small variations from the optimized conditions may produce large variations in the net tantalum deposition. Similar types of balancing is required for sidewall coverage, bottom removal, and only partial blanket etching. Heretofore, such balancing has been accomplished primarily by variations of target power, bias power, and coil power. More controlled variables would ease the optimization process and perhaps provide a wider process window.

Auxiliary magnet arrays have been proposed to control sputtering conditions. Permanent magnets have been shown to improve uniformity in the configuration of a simple DC magnetron sputter reactor without an RF coil. However, optimization is still difficult because the magnetization amount is not easily changed. Solenoid coils have also been suggested. While the DC power driving a solenoid coil can be more easily varied, it is still only one additional control. Furthermore, solenoid coils introduce an issue of stray magnetic fields being produced outside the chamber. Sputter reactors are often closely spaced on a cluster tool to other sputter reactors or other types of reactors relying upon tightly controlled magnetic field. Cross effects need to be avoided. A general rule is that stray magnetic fields should not exceed 1 gauss (compared to terrestrial magnetism of about ½ gauss) at 20 inches (50 cm) from the center of the reactor. The distance corresponds generally to the location of a neighboring reactor on a cluster tool The low level of stray field presents a stringent requirement for reactors processing 300 mm wafers.

Electromagnets have been applied to sputtering reactors, as disclosed by Wang in U.S. Pat. No. 6,352,629 and Wang et al. in U.S. Pat. No. 6,730,196. Gung et al. have disclosed two coaxial electromagnets of substantially the same radius for use in a sputter reactor in commonly assigned U.S. patent application Ser. No. 10/608,306, filed Jun. 26, 2003 and now issued as U.S. Pat. No. 6,041,201.

As the feature sizes on integrated circuits continue to decrease and the depth and thicknesses of various layers also decrease, the use of highly energetic sputter ions in achieving sidewall coverage and removing bottom barrier layers in high aspect-ration vias is disfavored because of the damage they may cause. Nonetheless, the selective deposition and removal are still needed.

Wafer transfer and chamber pump down present high overhead. Accordingly, it is desired to reduce the number of chambers needed in achieving the desired structure. It is known to use a sputter reactor in a number of different modes, for example, with varying wafer bias and varying ionization fractions during different steps of the process. It is possible also to sputter the wafer with argon after the barrier metal has been deposited to remove overhangs or bottom barriers. Heretofore, chambers have not been optimized for multiple operating modes. It would be desirable to provide different magnetic focusing in these different steps.

A further consideration is that similar sputter reactors are used in different processes, for advanced applications including both tantalum and copper deposition as well as the deposition of some refractory metals. Even for tantalum barrier deposition, different fabrication lines optimize for different designs, and integrated circuit design evolve over time even for the same manufacturer. It is thus commercially advantageous to produce a sputter reactor that is flexible enough to allow easy process optimization and to be adapted to satisfy the needs of different deposition steps and materials.

SUMMARY OF THE INVENTION

A plasma sputter reactor includes an array of electromagnetic coils arranged about the axis of the chamber. At least two of the coil electromagnets have different radii. Preferably the array includes three electromagnets and more preferably four arranged in a rectangular array.

The invention also includes a multi-step deposition process in which the electromagnets are different powered in the different steps to produce different magnetic field distributions.

The electromagnet array is advantageously applied to a sputter reactor having an RF coil for powering a plasma, and the away is placed generally in back of the RF coil. The RF coil may also be DC biased to promote sputtering A multi-step process of the invention includes different powering of the RF Multiple independent power supplies or current switching circuitry selectively applies different ratios of currents to different ones of the coils in the array. Thereby, the sputter reactor can operate in different modes. In particular, one mode with one coil current distribution sputters material from the target onto a substrate, and another mode with another coil current distribution sputter etches the substrate, for example, with argon ions.

The invention is also useful for reducing stray magnetic fields extending far outside the sputter reactor, possibly affecting other reactors. The magnetic shielding is enhanced by a magnetic core between the coils and a specified ratio of counter rotating coil currents between the inner and outer coils.

The quadruple electromagnetic coil array may be wound on a winding spool. The two inner coils are first wound with a non-magnetic radial separator between them. An tubular, axially extending separator is slid over the outside of the inner coils and it includes another non-magnetic radial separator. The outer two coils are wound over the tubular separator. In some embodiments, the tubular separator is advantageously formed of magnetic material, thereby reducing stray magnetic field outside the chamber and reducing the currents needed for a given magnetic field strength inside the chamber.

The multiple-coil array may be cooled by water or other refrigerant circulating through a helical cooling coil fixed to thermally contact at least two of the electromagnetic coils, for example, on the radial exterior. A metallic coil separator facilitates thermal transfer from the radially outer cooling coil to the inner coils.

The invention also includes a multi-step process practiced in such a sputter reactor depositing a barrier layer including an etching step. An embodiment of the multi-step process includes the sputter deposition of a barrier layer formed of refractory metal, such as tantalum, and its nitride under high target powering to promote sputter ionization and strong wafer biasing to increase the ion energy and directionality, thereby providing high sidewall coverage and low bottom coverage in the via. The nitride is preferably sputtered with higher energy than the refractory metal so that the nitride bottom coverage is low, possibly zero, and can further clean the underlying contact. An argon etch step is performed with minimal target power and significant RF power to the coil. A flash sputter deposition of the refractory metal is performed to produce high neutral sputter flux to assure field coverage.

DETAILED DESCRIPTION OF THE PREFERRED EMBODIMENTS

Figure 1:
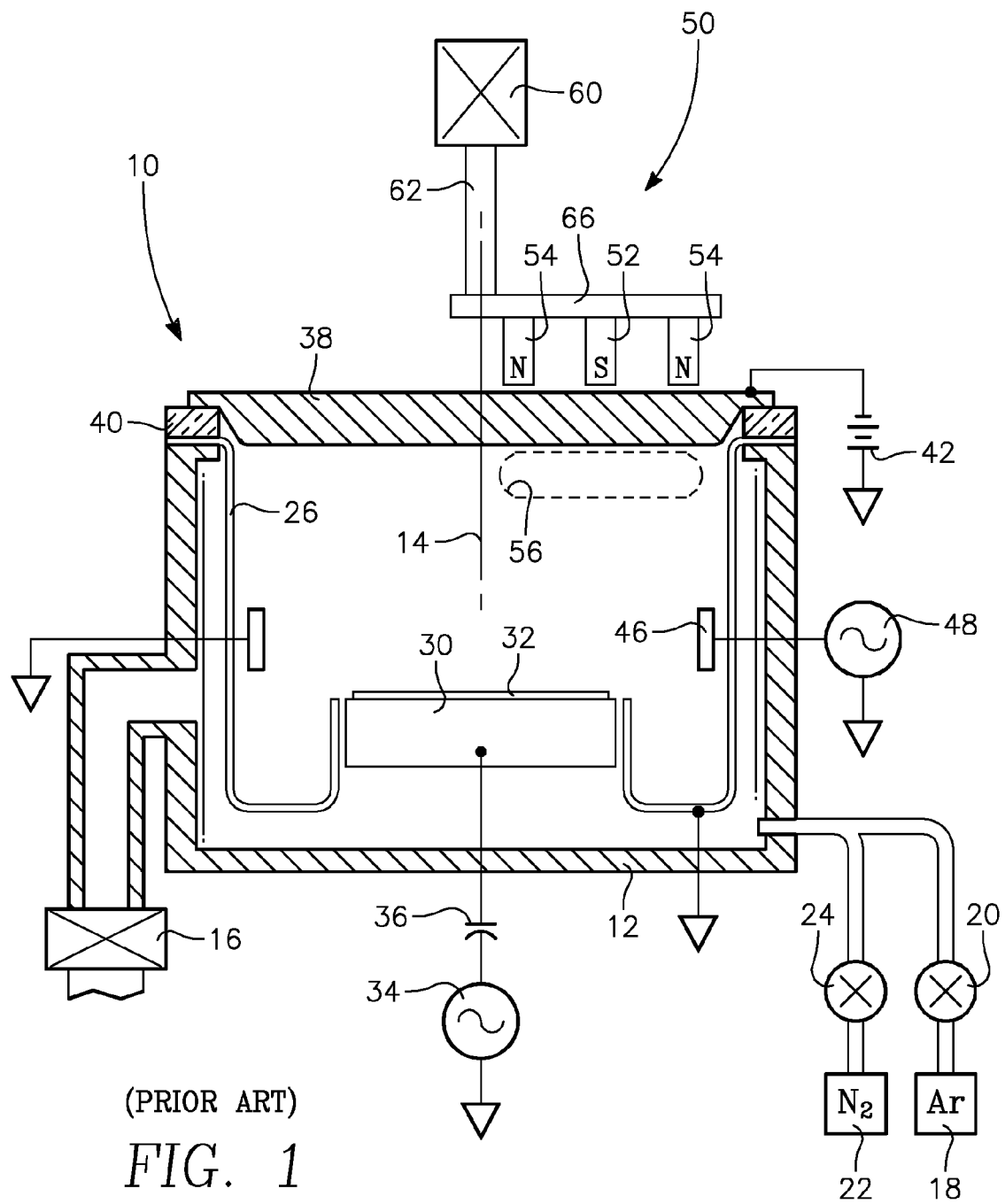
FIG. 1 is a cross-sectional view of a conventional tantalum sputter reactor.
Figure 2:
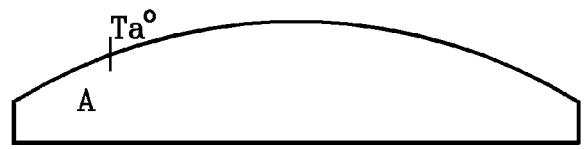
FIGS. 2 through 4 are schematic plots of flux profiles across the wafer diameter for neutral tantalum, tantalum ion, and argon ions respectively in the reactor of FIG. 1.
Figure 3:
Figure 4:
Figure 5:
FIGS. 5 through 7 are schematic plots of tantalum deposition profiles across the wafer diameter for zero bias, optimized bias, and over bias respectively in the reactor of FIG. 1.
Figure 6:
Figure 7:

One aspect of the invention relies upon multiple solenoid coils or electromagnets, preferably arranged in an array, to flexibly tailor the magnetic field within the sputter chamber in multiple steps of a sputter and etch process enabled by the invention. A plasma reactor 70 illustrated schematically in cross section in FIG. 8 includes a quadruple electromagnet array 72 positioned generally in back of the RF coil 46. The quadruple electromagnet array 72 includes four solenoidal coils 74, 76, 78, 80 wrapped generally circularly symmetrically about the central axis 14 of the reactor 70. The coils 74, 76, 78, 80 are preferably arranged in a two-dimensional array extending around the central axis. The nomenclature is adopted of the top inner magnet (TIM) 74, top outer magnet (TOM) 76, bottom inner magnet (BIM) 78, and bottom outer magnet (BOM) 80. The coils 74, 76, 78, 80 may each be separately powered, for example, by respective variable DC current supplies 82, 84, 86, 88, preferably bipolar DC supplies. Corresponding unillustrated grounds or return paths are connected to the other ends of the multi-wrap coils 74, 76, 78, 80. However, in the most general case, not all coils 74, 76, 78, 80 need be connected to a common ground or other common potential. Other wiring patterns are possible. All coils 74, 76, 78, 80 have at least one and preferably two end connections that are readily accessible on the exterior of the assembled chamber to allow connection to separate power supplies or other current paths and to allow easy reconfiguration of these connections, thereby greatly increasing the flexibility of configuring the chamber during development or for different applications. In production, it is possible that the number of current supplies 82, 84, 86, 88 may be reduced but the capability remains to selectively and separately power the four different coils 74, 76, 78, 80, preferably with selected polarities, if the need arises as the process changes for the reactor 70. Further, current splitters and combiners and serial (parallel and anti-parallel) connections of coils can be used once the general process regime has been established.

Figure 20:
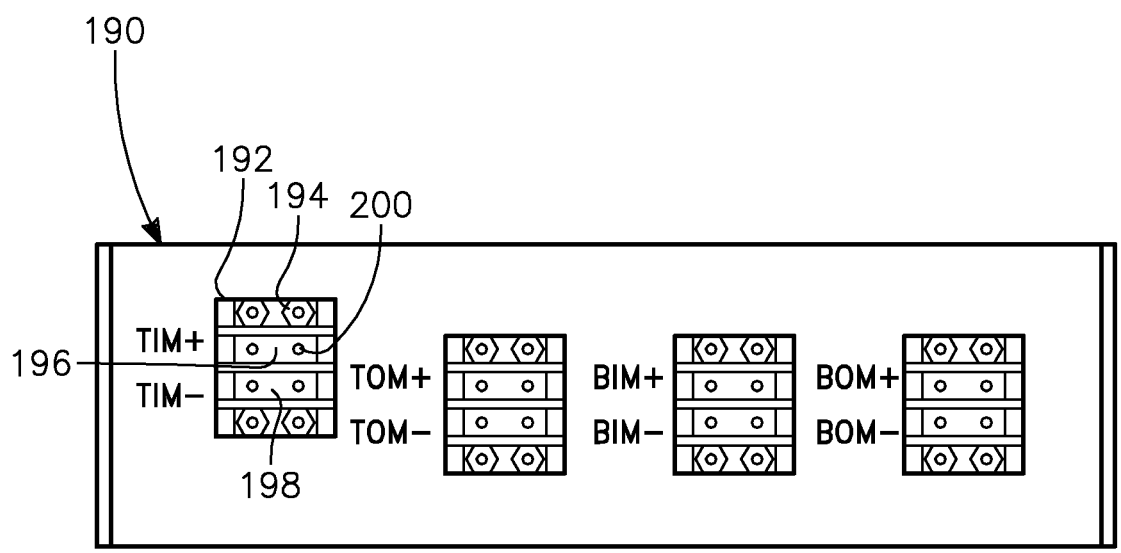
FIG. 20 is a plan view of the electrical terminal board for electrically connecting to the electromagnet array.

Particularly during process development, it is advantageous to lead the eight wires of the four coils 74, 76, 78, 80 to respective terminals of a connection board, to be described later with respect to FIG. 20. Other terminals of the board are connected to one or more power supplies 82, 84, 86, 88. An operator can manually reconfigure the connection scheme with jumper cables between selected pairs of terminals without disassembling either the coil array 72 or the sputtering chamber 70. It is possible also to use electronically controlled switches for the different configurations.

A DC power supply 49 is also connected to the RF coil 46 to apply a DC voltage to it to better control its sputter. The illustrated parallel connection of the coil RF supply 48 and the coil DC supply 49 is functional only. They may be connected in series or coupling and filter circuits may be used to allow selective imposition of both RF and DC power, for example a capacitive circuit in series with the RF power supply 48 and an inductive circuit in series with the DC power supply 49. A single coil power supply can be designed for both types of power.

A controller 89 contains a memory 89, such as a disk, which is loaded with a process recipe for achieving a desired structure in the 32 wafer. The controller 89 accordingly controls the process control elements, for example, the vacuum system 16, the process gas mass flow controllers 20, 24, the wafer bias supply 34, the target power supply 42, the RF and DC coil supplies 48, 49, the magnetron motor 60 to control its rotation rate and hence the position of the magnetron, and the four electromagnet current supplies 82, 84, 86, 88.

Exact solutions are known for the vector magnetic field distribution produced by an ideal current loop with a radius $\alpha$ about a central axis and carrying a current $I_0$. See Schill, Jr. et al, "General Relation for the Vector Magnetic Field of a Circular Current Loop: A Closer Look," *IEEE Transactions on Magnetics*, vol. 39, no. 2, March 2003. The radial magnetic field $B_r(r, z)$ and axial magnetic field $B_z(r, z)$ at a radius r from the central axis and at a distance z along the axis relative to the axial position $z_0$ of the coil are given by $$B_r(r, z) = \frac{\mu_0 I_0}{2\pi} \frac{z - z_0}{r[(r+a)^2 + (z-z_0)^2]^{\frac{1}{2}}}$$
$$\left[ K(k) - \frac{2a}{rk^2}E(k) + \frac{-r^2 + a^2 + (z-z_0)^2}{\pi(r+a)^2 + (z-z_0)^2} \prod \left(k, -k^2, \frac{\pi}{2}\right) \right]$$

and $$B_z(r, z) = \frac{\mu_0 I_0}{4\pi\sqrt{ar}}$$
$$\left[ K(k) - \frac{2a}{rk^2}E(k) + \frac{-r^2 + a^2 + (z-z_0)^2}{2r^2}\left(1 - \frac{k^2}{2}\right)\prod \left(k, -k^2, \frac{\pi}{2}\right) \right].$$

In these equations, K(k) and E(k) are the complete elliptic integral functions of the first and second kinds respectively and $\Pi(\kappa, n, \pi/2)$ is the complete elliptic integral function of the third kind defined as $$\prod \left(k, n, \frac{\pi}{2}\right) = \int_0^{\frac{\pi}{2}} \frac{d\phi}{(1 + n\sin^2\phi)(1 - \kappa^2\sin^2\phi)^{\frac{1}{2}}}$$

where $$k^2 = \frac{4ar}{(r+a)^2 + (z-z_0)^2}.$$

Assuming all coils are symmetric about the same central axis, the same relation holds for all four coils, each located at a respective radius $\alpha_i$ and height $z_i$, and carrying a respective current $I_i$, and the total magnetic field is the sum of the four coil contributions. In the rectangular geometry of the electromagnet away 72 illustrated in FIG. 8, there are only two radii and two heights, the four combinations of which define the four coils, and these dimensions are not easily varied once the coil array has been manufactured, preferably in a unitary structure. However, the four currents are easily and separately variable to allow much freedom in tailoring the magnetic field distribution.

However, some further theory provides some guidance in determining the optimum current values. Inside the sputter reactor, the ability to control ion flux, both the sputtered metal ions and the working gas, determines the film properties of uniformity of the film across the wafer, including thickness, sidewall and bottom coverage, resistivity, and metallurgical phase. The operation of the sputter reactor is based upon the realization that the plasma inside the chamber shields most of the electrical field except in the plasma sheath region and that the effective way to change the ion flux relies on magnetic field shaping, which is governed by the continuity equation $$\nabla : J + \frac{\partial \rho}{\partial t} = L - R,$$

where L and R respectively represent the dissociation and recombination rates, where $$J = \rho v - D \nabla n$$

is the ion flux density, $$\rho = qn$$

is the charge density, $$\nabla : \left( \rho v - \frac{D_0}{1 + \omega^2 \tau^2} \nabla n \right) = L - R \quad D = \frac{D_0}{1 + \omega^2 \tau^2}$$

is the diffusion constant, and n is the number density.

Since the ions and neutrals travel very quickly, the rotating DC magnetron can be considered as stationary and the steady state condition is given by Since in the diffusion constant D the cyclotron frequency is related to the perpendicular magnetic field $$\omega = \frac{qB_\perp}{m},$$

the steady state continuity equation involves not only the magnetic field strength $B_\perp$ but also its gradient $\nabla B_\perp$.

The electromagnet array provides a more direct method of drawing the ionized sputter ions and argon ions towards the wafer edge by creating magnetic nulls near the edge. Magnetic nulls are known to act as ion sinks and to provide high plasma density in the region.

Figure 9:
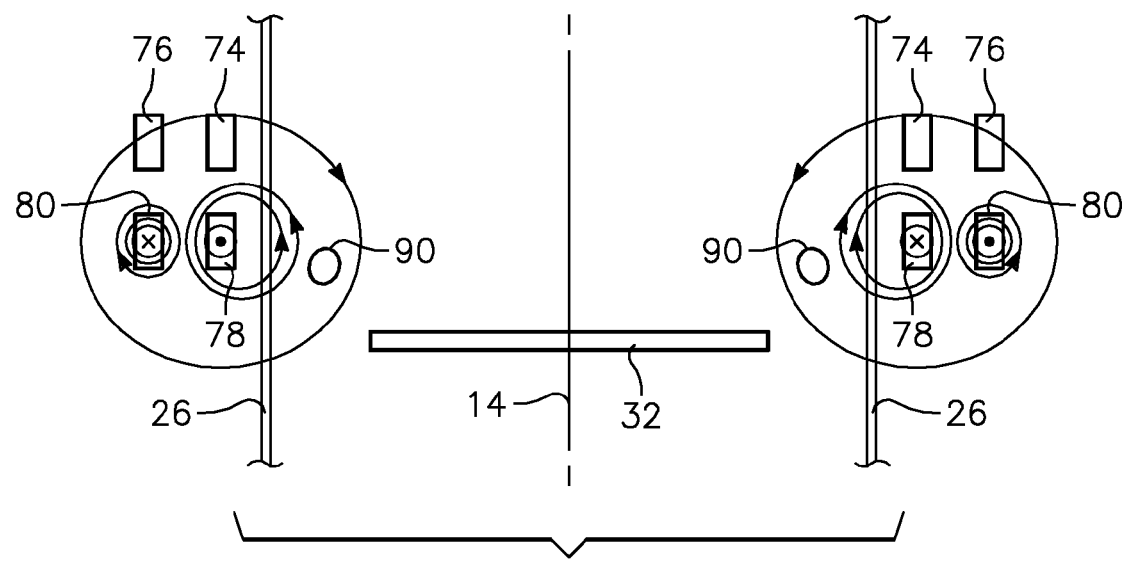
FIGS. 9 through 12 are schematic elevations of magnetic field distributions resulting from operating the quadruple electromagnet array in different modes.

A first example of the magnetic distribution producible by four electromagnetic coils, schematically illustrated in FIG. 9, powers only a single horizontal pair of coils, for example, the outer, lower coil 80 and inner, lower coil 78 although the upper coils 74, 76 could instead or additionally be used. This operation is called the inside/outside mode. A current of about 19 A in each coil having 182 turns is effective. As illustrated schematically, the two coils 78, 80 are powered with current flowing in opposite directions so as to create counter-rotating loops of magnetic field and the total magnetic field follows the polarity of the inner, lower coil 78. However, if there is greater current flowing in the outer coil 80 than in the inner coil 78, an annular magnetic null 90 is formed in the plane of the two coils 78, 80 near the edge of the wafer 32. The radial position of the null 90 depends upon the relative values of the anti-parallel coil currents. The null 90 creates a region of high plasma density near the wafer edge and prevents ions radially outward of the null 90 from diffusing to the low field region near the central axis. This magnetic field configuration is useful in the sputter deposition phase. On the other hand, if the current flowing in the outer coil is less than the counter-rotating current in the inner, lower coil 78, a larger magnetic null is created on the exterior, which may be useful for magnetic shielding purposes.

Stray fields can be significantly reduced in the up/down mode by powering the outside coils 76, 80 with currents opposite those of the inwardly neighboring coil 74, 78 and with a reduced current level, for example, 15 A in the inner coils 74, 78 and 7.5 A in the outer coils 76, 80. Particularly outside the chamber, the magnetic fields from the outer coils 76, 80 interfere with and substantially cancel the magnetic fields from the stronger inner coils 74, 78. Relative current levels are selected to produce a desired magnetic field distribution in view of the possibly different number of turns in the different coils.

Figure 10:
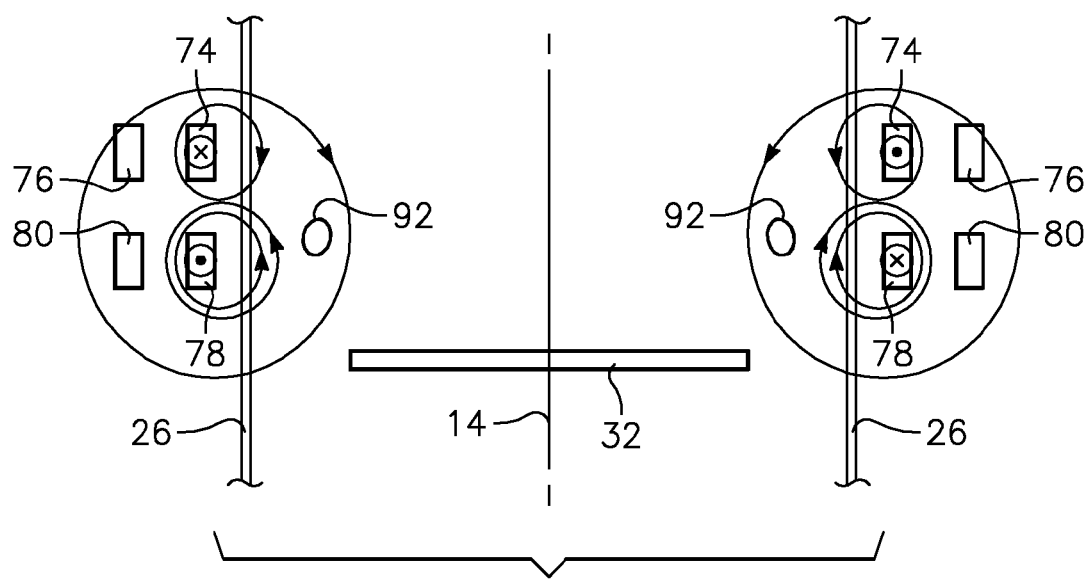

A second example, schematically illustrated in FIG. 10, powers only a single vertical pair of coils for example, the inner, top coil 74 and the inner, lower coil 78 and, as illustrated, the current flows in opposite directions in the two coils 74, 78. The operation is called the top/bottom mode. Even if the two anti-parallel currents are equal, a magnetic null is produced at a point in the weak-field region along the central axis. However, a substantially greater current in one of the coils 74, 78, for example, greater current in the upper coil 74, causes an annular null 92 to form away from the center axis 14 and nearer the target edge. Increased imbalance in currents pushes the null 92 radially closer to the shield 36 and axially closer to the stronger coil.

It is of course appreciated that all four coils 74, 76, 78, 80 can be powered with similar differential currents shown in the two examples. The inner and outer coils can be differentially powered and the upper and lower coils can simultaneously differentially powered to exercise more control over one or more nulls. Alternatively, either the inner and outer coils or the upper and lower coils can be similarly powered with the other set being differentially powered to produce more pronounced versions of either FIG. 9 or FIG. 10.

Figure 8:
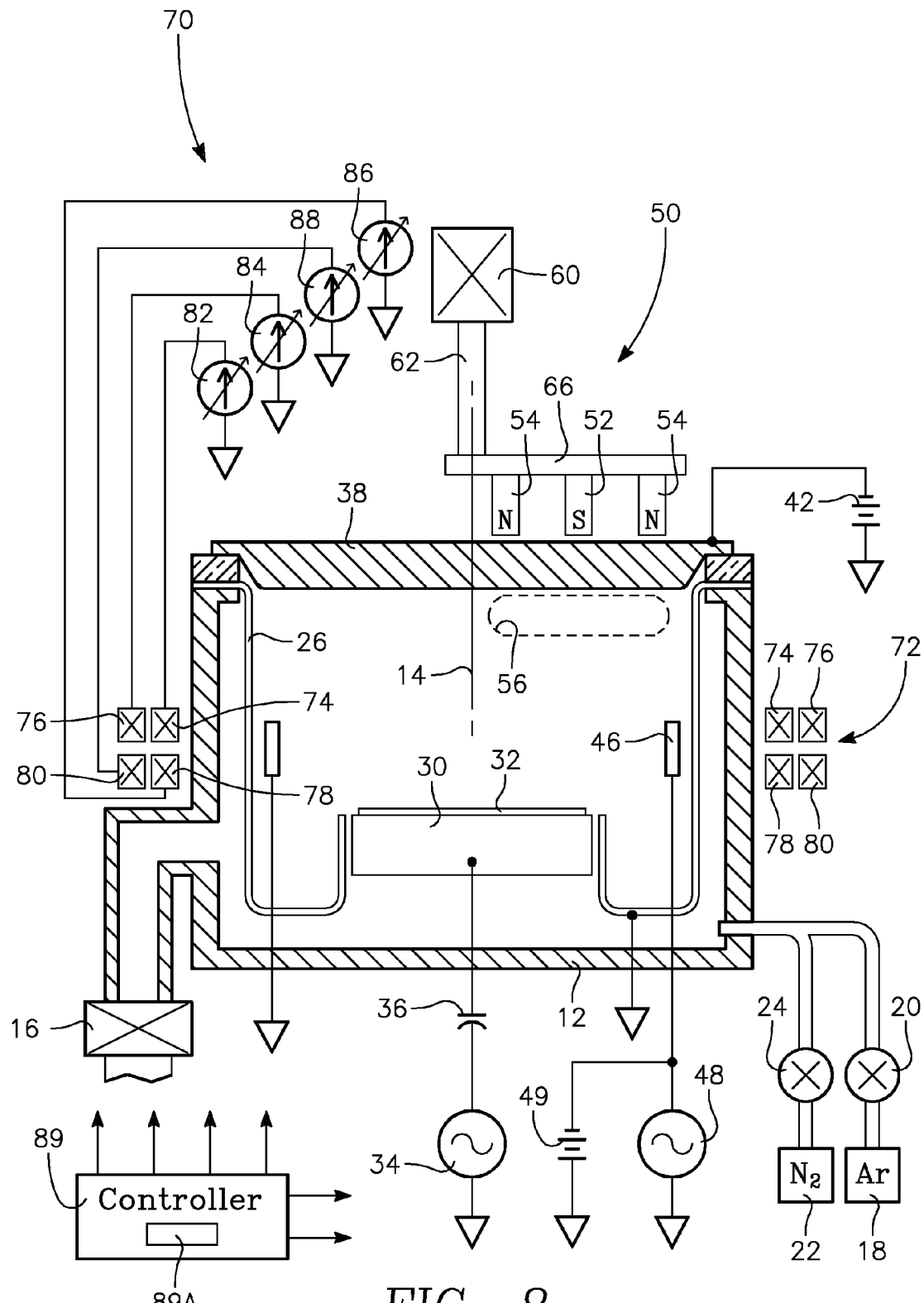
FIG. 8 is a cross-sectional view of a sputter reactor of the invention including a quadruple electromagnet array.
Figure 11:
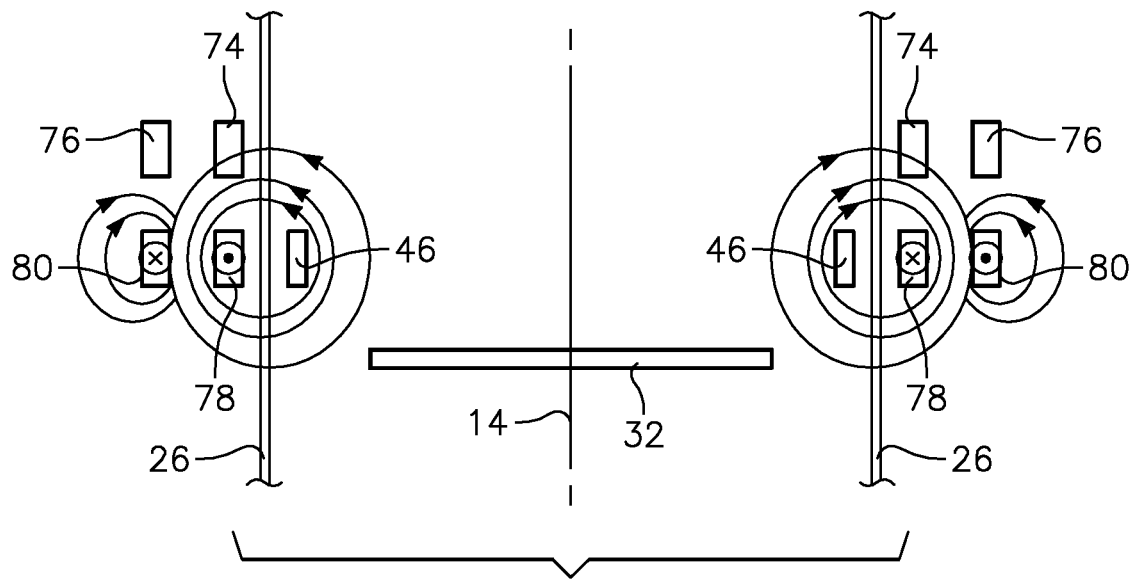

A third example, schematically illustrated in FIG. 11, uses the same coils in a different way during the etch phase of operating the reactor 70 of FIG. 8. In the etch phase, the target is not significantly powered but RF power is supplied to the RF coil 46. Assuming that the RF coil 46 is located axially even with the lower, inner coil 78, only that coil is strongly powered to a strong magnetic field parallel to the inner annular face of the RF coil 46 to confine the plasma It is not necessary to power the other coils 74, 76, 80. However, a lesser counter-rotating current can be applied to the bottom, outer coil 78. One major advantage is that the second magnetic field cancels the primary magnetic field particularly radially outside the outer coil 80 and thereby reduces the stray fields emanating outside the sputter reactor. If the coil assembly 72 is centered in back of the RF coil 46, then the upper coils 74, 76 may be powered with currents having the same magnitude and polarity as the currents in the corresponding lower coils 78, 80.

Figure 12:
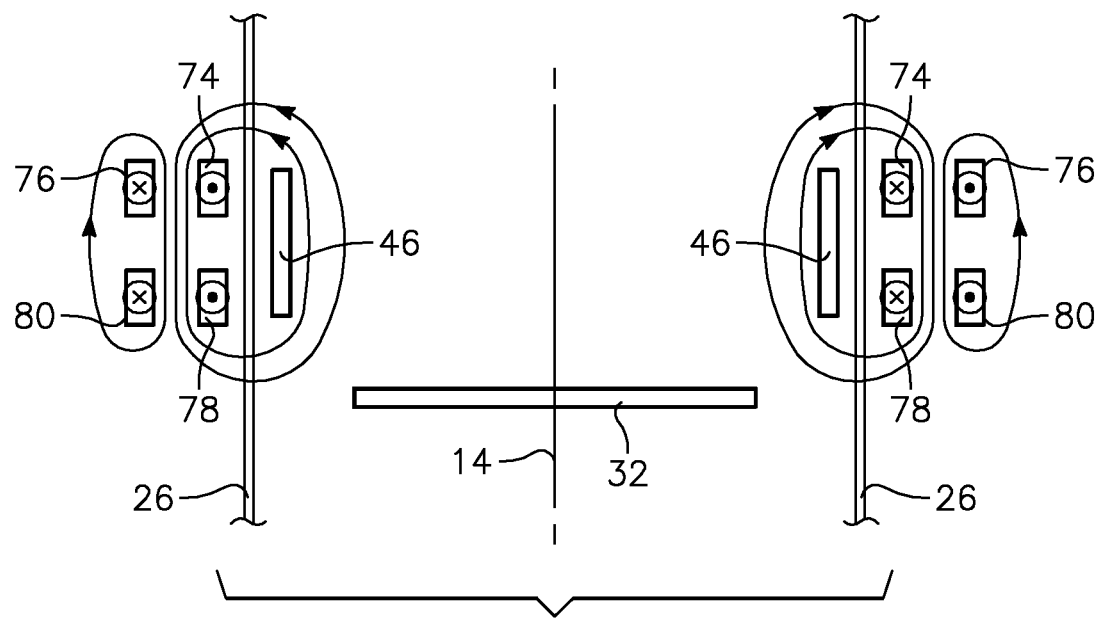

A fourth example, schematically illustrated in FIG. 12, is similar to the third example of FIG. 11 but supplied the same polarities of currents to the upper coils 74, 76 as to the corresponding underlying lower coils 78, 80. This configuration is particularly effective when the RF coil 46 is about as tall as the array 72 of electromagnets 74, 76, 78, 80.

Figure 13:
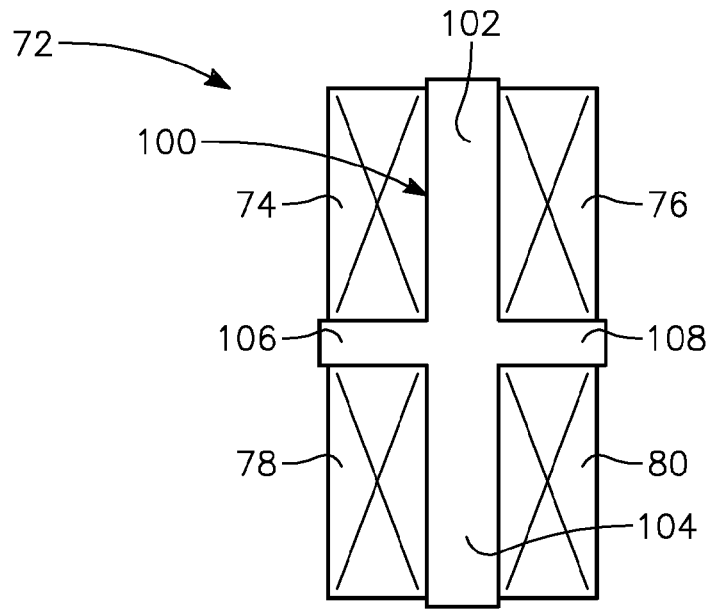
FIGS. 13 and 14 are cross-sectional views of two embodiments of the quadruple electromagnet array.

The quadruple coil assembly 72 can be formed, as illustrated in the cross-sectional view of FIG. 13, by wrapping or otherwise affixing multiple turns of insulated wire forming the four coils 74, 76, 78, 80 onto an annular separator 100 composed of a non-magnetic material such as polymer, plastic, or non-magnetic materials including aluminum and some types of stainless steel. The separator 100 includes two vertical arms 102, 104 separating the inner coils 74, 78 from the outer coils 76, 80 and two horizontal arms 106, 108 separating the upper coils 74, 76 from the lower coils 78, 80 to allow magnetic field to flow between the coils as through free space. The various arms 102, 104, 106, 108 may be separate. The separator 100 is generally circularly symmetric about the central axis 14 and is supported by a shelf extending outwardly from the sidewall of the vacuum chamber 12.

The coils can be wound on a winding spool. A rectangular annulus corresponding to the inner horizontal arm 106 is fixed to the winding spool. The two inner coils 74, 78 are wound with separate wires separated by the arm 106 with both ends of both wires being lead to the outside on the axial ends. If desired the wound wires can be potted with epoxy or other adhesive. After completion of the first winding, a tube corresponding to the vertical arms 102, 104 is slid over the wound inner coils 74, 78 or tubular segments may be assembled around them. Either the tube is formed with the outer horizontal arm 108 or a separate rectangular annulus is slid or assembled over the tube. Adhesive or welding may be used to provide a rigid annular separator 100. The two outer coils 76, 80 are then wound with the two pairs of wire ends being accessible after completion of winding and potting. The annular assembly 72 is then removed from the winding spool. If desired, mechanical structure is attached to the assembly 72 to provide protection and attachment.

Figure 14:
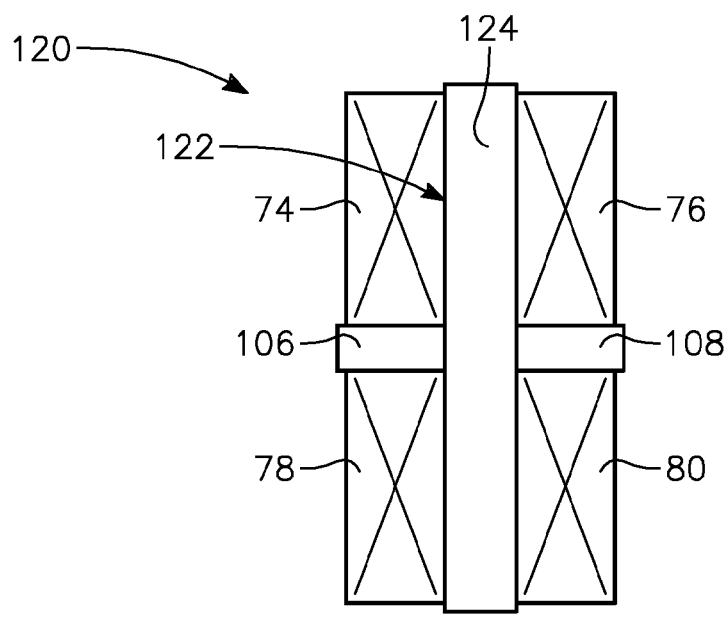

A modified quadruple coil assembly 120 with a magnetic core, illustrated in the cross-sectional view of FIG. 14, includes an annular separator 122 having a tubular magnetic core 124 formed of a magnetic material, such as Type 410 stainless steel. An exemplary thickness of the wall of the tube is 0.55" (1.4 cm) and a preferred thickness range is between 0.75 and 3 cm. The The arms 106, 108 may be non-magnetic material, but in at least some embodiments of the invention the arms 106, 108 are unnecessary. The horizontal arm thickness may be 0.25" (0.635 cm) and a preferred range is 0.3 to 1.2 cm. The overall size of the illustrated structure may be 3" and 1.75" wide (with ranges of a factor of two larger or smaller).

Another embodiment of an electromagnet array includes only two coils 74, 76 separated by the tubular magnetic or non-magnetic spacer 124. It is also possible in another embodiment that the arms 106, 108 be composed of magnetic material. Magnetic horizontal arms 106, 108 do not seem to severely affect the field distribution inside the chamber but plastic or aluminum horizontal arms provide satisfactory performance.

The magnetic core 124 does not significantly affect the magnetic field shape inside the chamber. It has been observed that in some modes the coil currents can be substantially reduced to produce similar magnetic field levels inside the chamber apparently arising from an image coil current in the magnetic core 124. The magnetic core 124 is particularly effective at reducing stray magnetic fields away from the chamber. It has been found that a outer current, whether in one or two coils, and an inner current, again whether in one or two coils, The electromagnetic coil array is advantageously integrated with an adapter 130 orthographically illustrated from above in FIG. 15 and from below in FIG. 16. Adapters are often used in the sputter reactor 10 of FIG. 1 to form part of the chamber 12 below the target 38 and above the pedestal 30. The lower part of the chamber 12 is relatively complex including the vacuum pumping port, gas supply port, and the slit valve for transferring the wafer 32 into and out of the chamber 12. The throw of the reactor 10 between the target 38 and the pedestal 30 can be adjusted by changing to a different length of adapter without the need for redesigning and refabricating the entire chamber. The adapter 130 of FIGS. 15 and 16 includes an aluminum adapter body 132 arranged about the central axis 14 having an upper face 132 formed with an O-ring groove 134 for sealing to the isolator 40 of FIG. 1 and a generally planar lower face 136 with an outwardly extending flange 138 to be supported on and sealed to an O-ring held in a similarly shaped portion of the lower portions of the chamber 12. A ledge 140 near the upper face supports and electrically grounds the chamber shield 26. Two ports 142, 144 are machined through the chamber body 142 to accommodate electrical vacuum feedthroughs for the RF power and ground lines to the RF coil 46, which is supported on but isolated from the shield 26.

Figure 17:
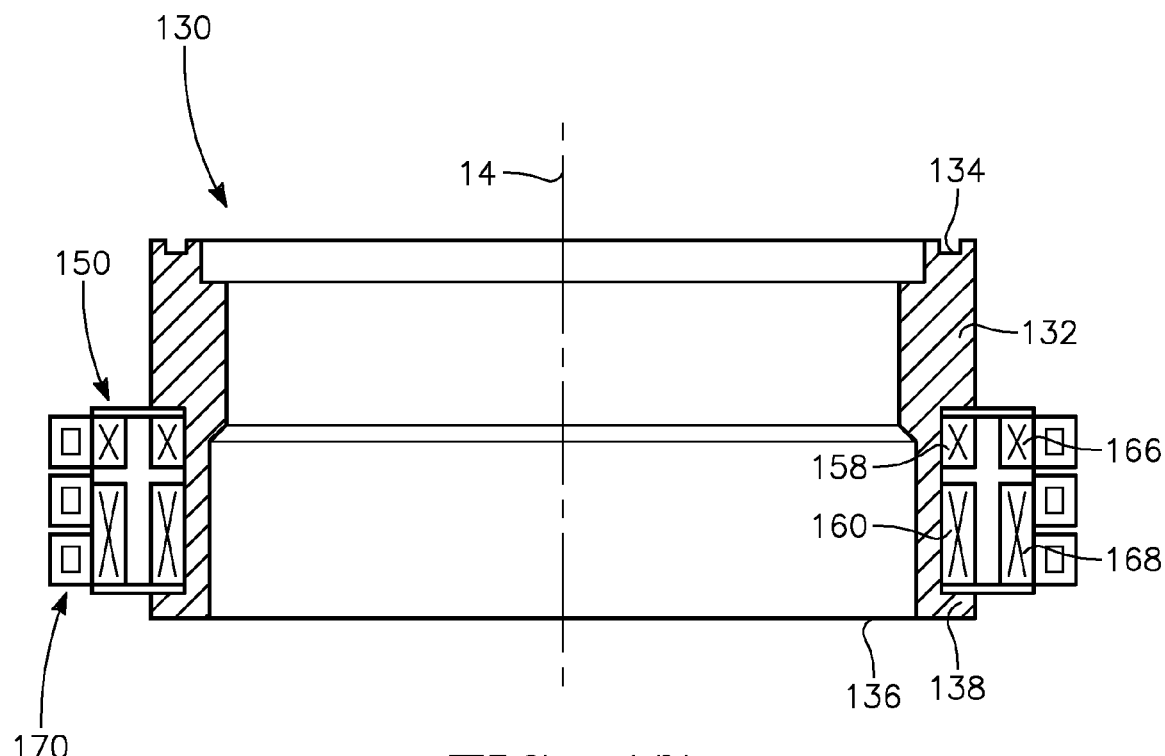
FIG. 17 is a cross-sectional view of the adapter of FIGS. 15 and 16.
Figure 18:
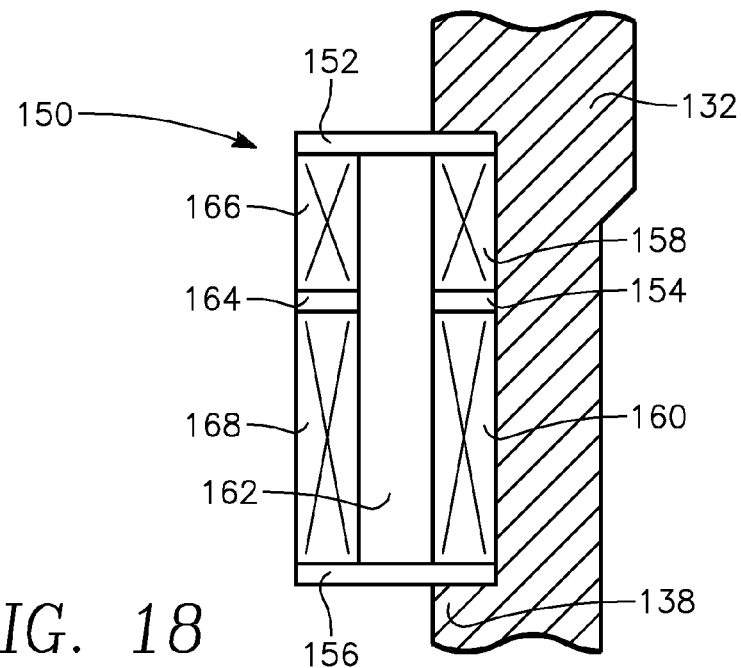
FIG. 18 is an exploded cross-sectional view of the electromagnet array and adapter of FIGS. 15-17.

The adapter 130, also illustrated in cross section in FIG. 17, includes a electromagnet coil array 150, illustrated further in the exploded cross section of FIG. 18. The coils are wrapped directly onto the adapter 130 in a multi-step process. First, three horizontally extending disk-shaped top, inner middle, and bottom spacers 152, 154, 156 are epoxied into an annular groove formed in the adapter body above the adapter flange 138. The spacers 152, 154, 156 are advantageously formed of a plastic such as G10 which is electrically insulating but mechanically strong. In this embodiment, the spacers are all non-magnetic. The spacers 152, 154, 156 may be formed of segments to fit within the outwardly facing groove. A top inner coil 158 and a bottom inner coil 160 are separately wound in the spaces formed between the spacers 152, 154, 156 from square-shaped copper magnet wire, for example, 13 AWG, covered with an thin insulating coating. Prior to winding, respective unillustrated start leads are mechanically and electrically fixed to the initial ends of the two coil windings. The start leads are multi-strand electrical cables with plastic covers and having lengths sufficient to extend well away from the coil array 150. During the winding, epoxy is continuously applied to bond the magnet wire into place. After completion of the winding of the two inner coils 158, 160, two end leads are fixed to the final ends of the two coil windings and similarly extend well away from the coil array 150. The wound coils 158, 160 are further epoxied into place.

A vertically extending tubular spacer 162, possibly assembled from tubular segments, is epoxied onto the exposed faces of the two inner coils 158, 160 and the inner middle spacer 154 and a disk-shaped outer middle spacer 164 is epoxied to the tubular spacer 162 generally in the plane of the inner middle spacer 154 but accommodating the lead wires from the inner coils 158, 160. The outer middle spacer 164 extends radially outwardly to the outer radius of the top and bottom spacers 152, 156. The tubular spacer 162 is advantageously formed of aluminum to increase thermal conductivity while the outer middle spacer 164 may be formed of G10. A top outer coil 166 and a bottom outer coil 168 are then separately wound from the magnet wire in the two spaces formed between the outer middle spacer 164 and the top and bottom spacers 152, 156. The winding process follows that of the two inner coils 158, 160 and separate start and end leads are connected to the outer coils 166, 168 and extend away from the coil array 150. All the coils 158, 160, 166, 168 may have seven layers of windings but the bottom coils 160, 168 advantageously have about twice as many turns as the top coils 158, 166. It has been found that better magnetic distribution and cooling results are obtained with substantially more turns in the upper coils 158, 166 than in the lower coils 160, 168, e.g. 182 vs. 228 in each respectively, that is, greater by at least 50%.

Although the coils are advantageously positioned outside the chamber wall, it is possible to place them inside the vacuum chamber and thus closer to the processing area. The invention thus provides great flexibility for operating advanced sputtering and other plasma processing equipment, both for a particular mode of operation and for alternating between different modes.

Figure 19:
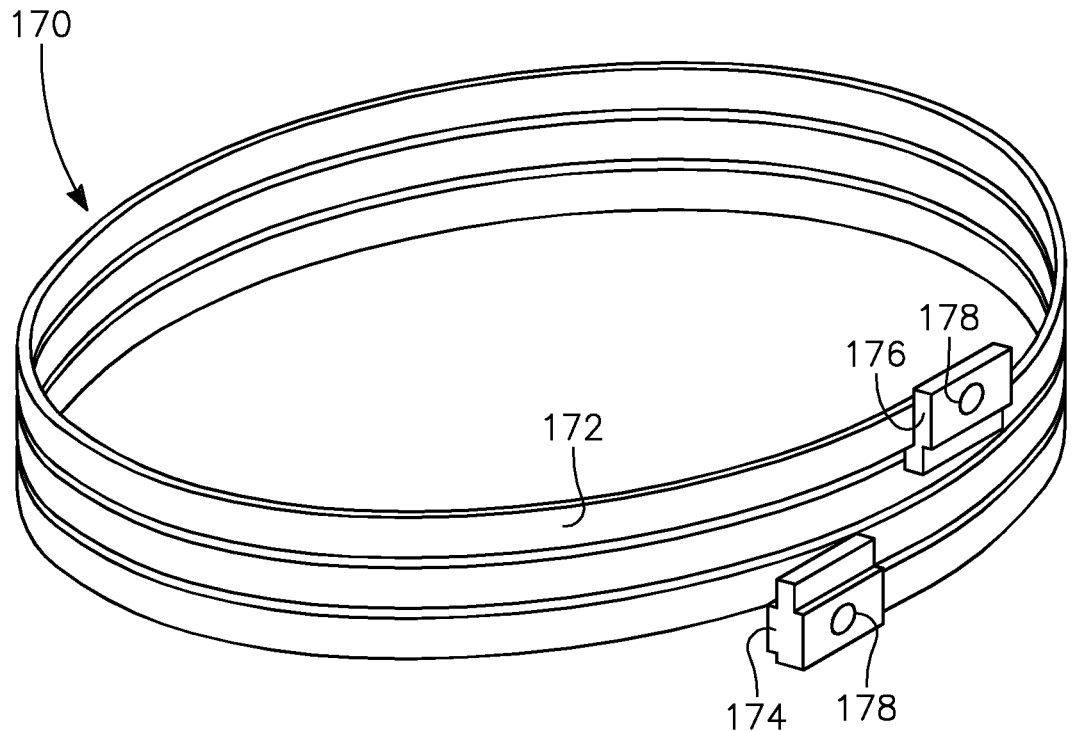
FIG. 19 is an orthographic view of the cooling coil of FIGS. 15-17.

A water cooling coil 170, illustrated in the orthographic view of FIG. 19, includes three helical wraps of an extruded rectangular aluminum tube 172 with an interior fluid cooling channel extending axially therealong. Two aluminum water fixtures 174, 176 are welded to the ends of the aluminum tube 174 and include water ports 178 to the interior of the tube 172 and unillustrated screw holes for mounting the coil 170 to the adapter and for mounting the water supply lines to the fixtures 174, 176. The rectangular tube 174 is wrapped and pre-bent on a mandrel having a diameter equal to the outer diameter of the coil array 150 of FIGS. 17 and 18. The helical water cooling coil 170 is flexible enough to allow it to be expanded and slid over the flange 138 at the bottom of the adapter 130 of FIGS. 16 and 17 and to be tightly fit to the exterior of the electromagnetic coil array 150 when the cooling coil fixtures 174, 178 are mounted on the adapter body 132 through a bracket 180 and the cooling coil 170 is epoxied to the exterior of the electromagnetic coil array 150.

In operation, a source of chilled water or other cooling fluid or refrigerant is supplied and removed via the water ports 178 in the water fixtures 174, 176 to circulate through the water coil 170 and cool the electromagnetic coils. The cooling coil 170 has the advantage of a single coil and chilling system cooling multiple electromagnetic coils. The locally planar geometry presented by the tabularly shaped cooling and electromagnetic coils promotes efficient cooling. The aluminum or other metallic tubular spacer 162 promotes heat transfer between the radially arranged coils. The use of multiple wraps in the cooling coil cools a larger area and increases heat transfer. Other cooling coil structures may be used with the electromagnet array including those having cooling passages within the array.

Figure 15:
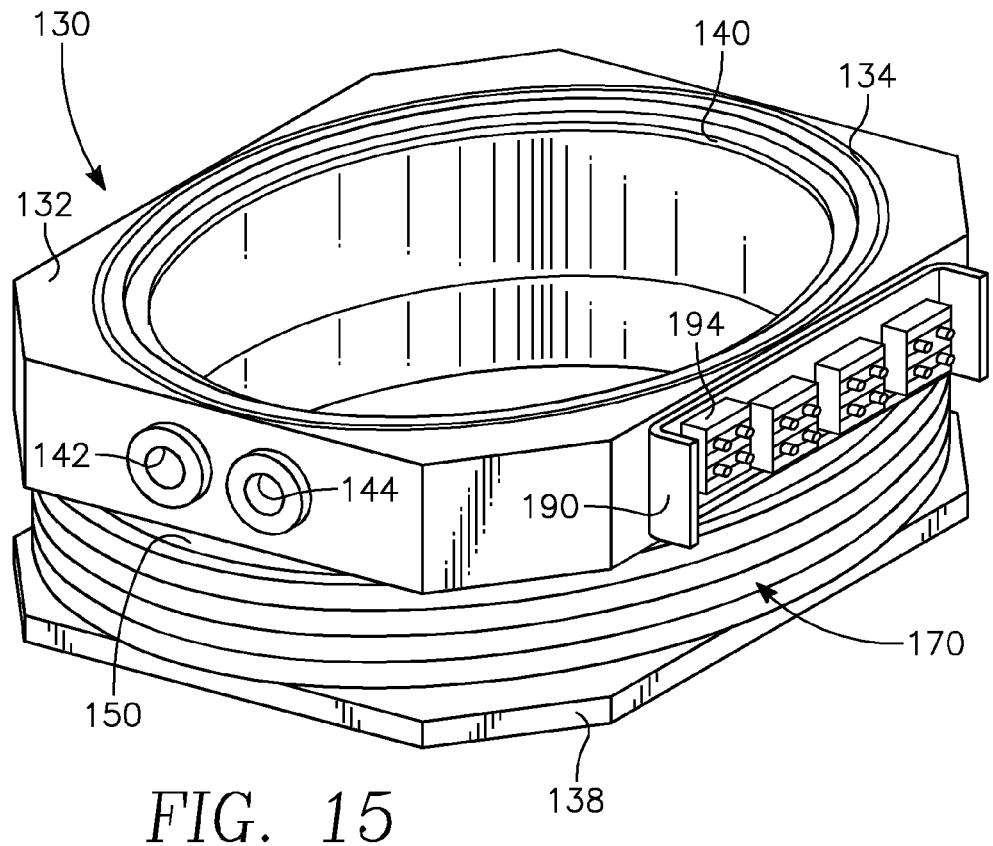
FIGS. 15 and 16 are orthographic views taken respectively from the top and bottom of a chamber adapter including the quadruple array of electromagnet coils and a cooling coil.
Figure 16:
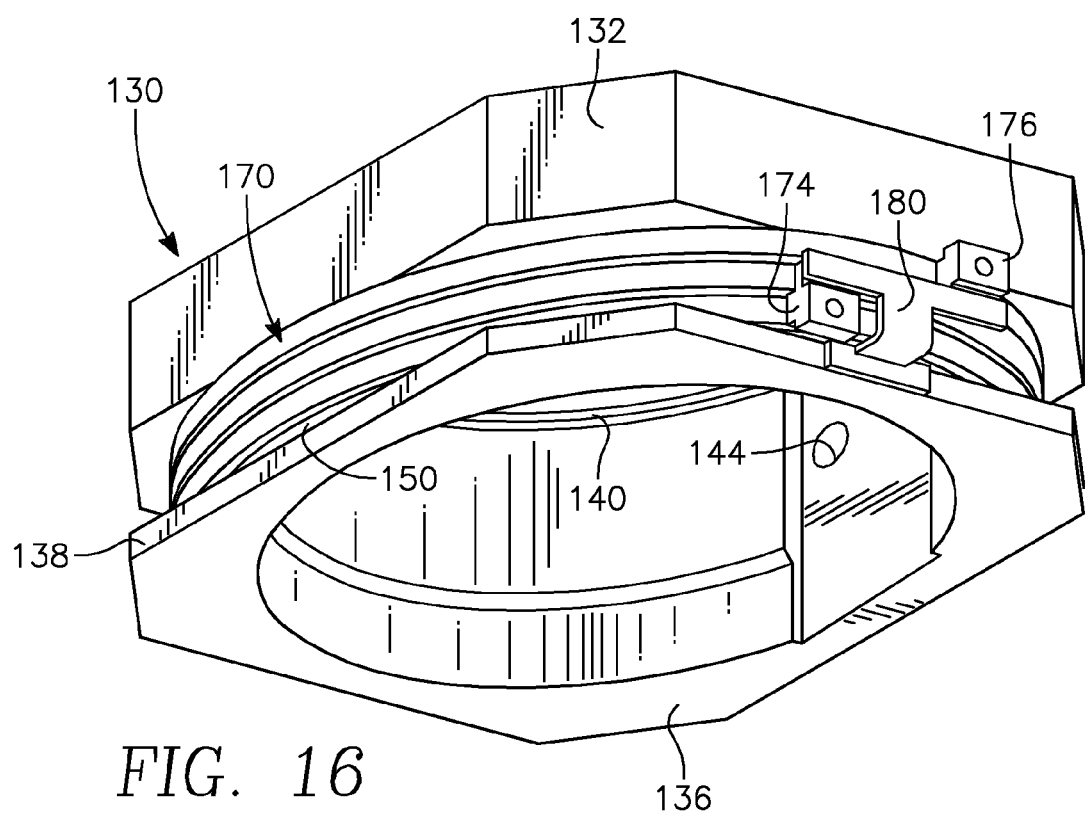

As illustrated in FIG. 15, a terminal block bracket 190 is screwed to the adapter body 132 and includes four terminal blocks 192 associated respectively with the four electromagnetic coils 158, 160, 166, 168. Each terminal block 192, as better illustrated in the elevational view of FIG. 20, includes four nuts 194 fixing the terminal block 192 to the bracket 190 and hence to the adapter body 132 and further includes two terminal strips 196, 198 having two screw holes 200 for attachment of lug screws. One lug screw semi-permanently fixes the start lead from one coil to one terminal strip 194 and another lug screw semi-permanently attaches the end lead from the same coil to the other terminal strip 194 of the same block 192. The figure illustrates the positions of eight leads TIM+, TIM−, etc. for the start and end leads for the top inner magnet coil, etc. The remaining eight screw holes 200 on the four terminal blocks 192 allow further lug screws or other means to fix external or connecting cables to electrically connect to the eight start and end leads of the four electromagnetic coils. The terminal strips 196, 198 are easily accessible from the exterior of the adapter 130 even when mounted in the reactor 70 of FIG. 8 and covered by the cooling coil 170 to allow easy reconfiguration of the electrical connections for the four electromagnetic coils. For example, coils may be connected in series, have common grounds, have their polarities reversed, or be selectively removed from service without needing to disassemble the reactor 70 or the electromagnetic coil array 150.

Another aspect of the invention includes the use of two concentric but spaced coils with counter-propagating currents. As mentioned above, either a non-magnetic spacer or a magnetic core may be interposed between the coils. For improved cooling, the spacer is advantageously formed from a metal such as aluminum.

Although a rectangular array of coils is particularly advantageous, the four coils may form a parallelogram or other four-sided array. A triangular array of three coils also provides many of the advantages of the invention. Although the coils may advantageously be wound outside of the chamber walls, it is possible to form them inside the vacuum chamber.

The quadruple electromagnet array 72 and RF coil 46 can also be advantageously combined with the variable spacing between magnetron and target, described in the background section and by Hong et al. in U.S. patent application Ser. No. 10/942,273, filed Sep. 16, 2004, incorporated herein by reference in its entirety.

Figure 21:
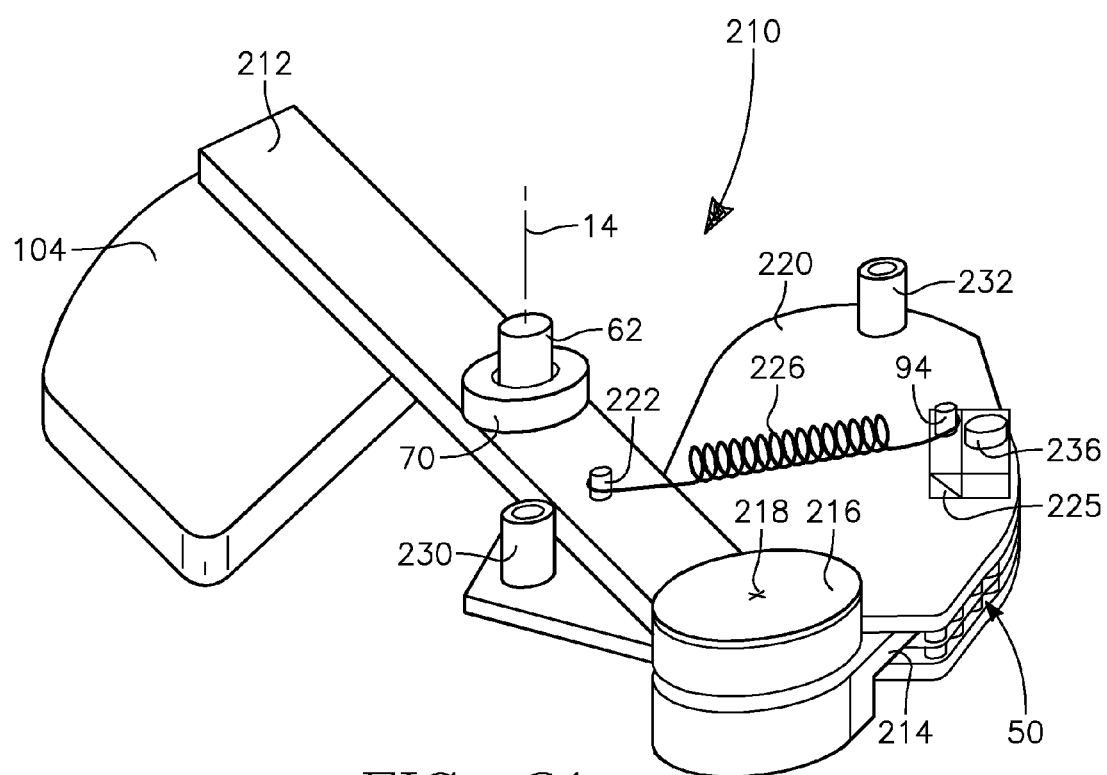
FIG. 21 is an orthographic view of a centrifugal, two-position magnetron.

The quadruple electromagnet array 72 and RF coil 46 can advantageously be combined with a magnetron 50 that can be moved radially on the target 38 to allow the target to be cleaned, among other reasons. Subramani et al. disclose such a movable magnetron in provisional application 60/555,992, filed Mar. 24, 2004. Gung et al. disclose a more general mechanism and process in Ser. No. 10/949,735, filed Sep. 23, 2004 and now issued as U.S. Pat. No. 7,018,515, incorporated herein by reference in its entirety. The radially movable magnetron of Subramani et al. includes a dual-position centrifugal pivoting magnetron assembly 210, illustrated in the orthographic view of FIG. 21, which is switchable between two rotation radii dependent upon the speed of rotation in a single rotation direction. The magnetron assembly 210 includes a bracket 212 that is fixed to the rotary drive shaft 62 rotating about the central rotation axis 60 of the reactor. The end of one arm of the bracket 212 rotatably supports beneath it a pivot plate 214 through a pivot mechanism 216 that allows the pivot plate 214 to pivot about a pivot axis 218. The pivot plate 214 supports a back plate 220, which is composed of a ferromagnetic material to form the yoke of the magnetron 50. For structural purposes, the back plate 220 can be considered as part of the pivot plate 214 since they pivot together about the pivot axis 218. One bushing 222 is affixed to the bracket 212 between the rotation axis 14 and the pivot mechanism 216 and another bushing 224 is fixed to a mount 225 on the back plate 220. The two ends of a tension spring 226 are attached to the two bushings 222, 224. A first nylon stop 230 is screwed to the pivot plate 84 on one side of the bracket 212 and a second nylon stop 232 is screwed to the back plate 220 on the other side of the bracket 212. Each stop 230, 232 includes a metal knob with a through hole for the screw and a tubular soft, resilient nylon sheath fit on its outside to buffer the impact and shock of the sudden abutment against the bracket 212. The spring 226 biases the side of the back plate 220 with the second stop 232 towards the bracket 212 and hence biases the magnetron toward the rotation axis 60. However, pivoting in the inward direction is limited by the second stop 232 abutting and engaging the bracket 212. On the other hand, rotation of the drive shaft 62 exerts significant centrifugal force on the heavy magnetron 50 and associated elements and pushes the side of the back plate 220 with the second stop 232 away from the bracket 82 in the radially outward direction away from the rotation axis 60. However, pivoting in the outward direction is limited by the first stop 230 abutting and engaging the bracket 82. The speed of rotation determines whether the inward spring biasing or the outward centrifugal force prevails. A magnetic emitter 236 mounted on the back plate 220 allows a magnetic detector mounted on the rigidly mounted on the reactor above the rotating magnetron 50 to determine if the magnetron 50 is in the inner or the outer position.

Figure 22:
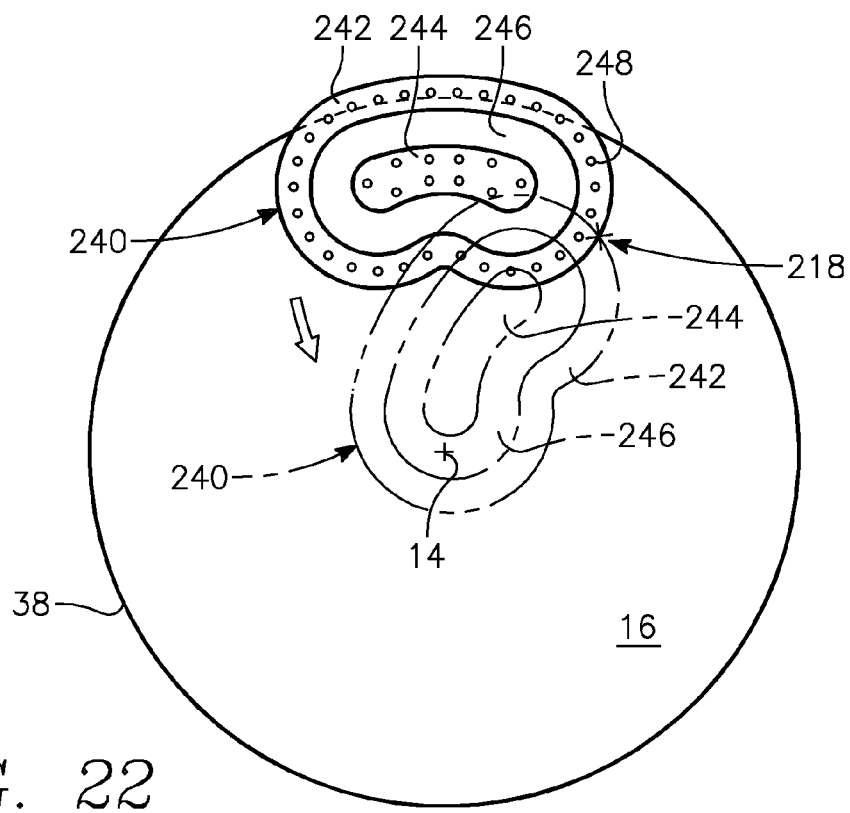
FIG. 22 is a plan view of the two positions of the magnetron on the target.

A preferred implementation of the magnetron 50 is an arc-shaped magnetron 240 (also called an LDR magnetron) illustrated in bottom plan view in FIG. 22. The solid lines show the arc-shaped magnetron 240 in its outer position on the back side of useful area of the target 38 and the hashed lines show it in its inner position as it pivots about the pivot axis 218. The arc-shaped magnetron 240 includes a band-shaped outer pole piece 242 and an enclosed arc-shaped inner pole piece 244 separated by a gap 246. Holes 248 in the two pole pieces 242, 244 capture ends of respective sets of cylindrical magnets polarized in opposite directions along the rotation axis 14 and illustrate that the total magnetic intensity of the outer pole 242 is substantially larger than that of the inner pole 244.

Figure 23:
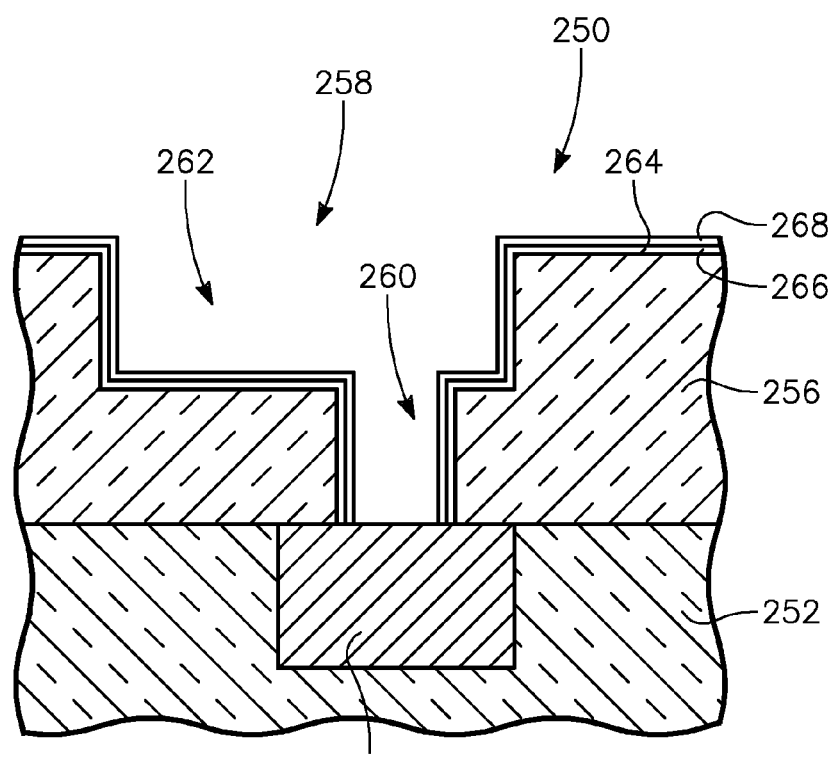
FIG. 23 is a cross-sectional view of a dual-damascene liner structure achievable with the invention.

The combination of the RF coil 46, the quadruple electromagnet array 72, the selectively biased pedestal electrode 30, and the dual position magnetron allows a flexible multi-step process in effectively forming a barrier structure for copper metallization in a dual-damascene liner structure 250 illustrated in the cross-sectional view of FIG. 23. A lower dielectric layer 252 has a copper contact 254 formed in its upper surface. An upper dielectric layer 256 is deposited over the lower dielectric layer 252 and a dual-damascene hole 258 is etched through the upper-level dielectric layer 256. The dielectric layers 252, 256 are typically formed of materials based upon silicon oxide, simply referred to as oxide layers. There is intensive development of low-k dielectrics in which either the oxide is doped or alternative materials are used. The dual-damascene hole 258 includes a narrow via hole 260 in the lower half of the upper dielectric layer 256 overlying the copper contact 254 and a wider trench 262 in the upper half. Eventually, both the via hole 260 and the trench 262 are filled with copper as an upper-level metallization in an ECP process to both contact the copper contact 254 and provide a vertical interconnect between two metallization layers and to further provide a horizontal interconnect through the trench 262 in the upper-level metallization. The copper contact 254 is typically formed in a corresponding trench in the lower dielectric layer 252.

It is important that the copper filled into the via hole 260 and trench 262 adhere to the oxide and not diffuse into the oxide. Further, a copper layer subsequently deposited into the dual-damascene hole 258 adhere to the underlying layer. Accordingly, a liner layer is deposited in the dual-damascene hole 258, but it is greatly desired to vary the deposition within different portions of the dual-damascene hole 258 and in a field regions 264 on top of the upper dielectric layer 256.

For copper metallization, a typical liner layer includes a tantalum nitride (TaN) layer 266 and an overlying tantalum (Ta) layer 268. The TaN layer 266 adheres readily to oxide and forms an effective diffusion barrier. As a result, it should form a continuous layer on the sidewalls and floor of the trench 262 and on the sidewalls of the via hole 260. The TaN layer 266 does not necessarily need to extend in the field region 268 since any copper overlying the field region 264 is removed in a subsequent step of chemical mechanical polishing (CMP). However, tantalum nitride is poor conductor and should be removed or have minimal thickness at the bottom of the via hole 260. The Ta layer 268 adheres well to the TaN layer 266 and copper adheres well to tantalum and effectively nucleates the growth of copper but copper does adhere well to tantalum nitride. Accordingly, the Ta layer 268 should be continuous on the sidewalls of the trench 262 and the via hole 260 and on the floor of the trench 262. Tantalum is moderately conductive so the Ta layer 268 may cover the bottom of the via hole 260 or it may advantageously be absent there. The tantalum layer 268, however, should cover the field region 264 to at least form a nucleation and adhesion layer for a copper seed layer formed over it which acts as an electrode and plating current path during the subsequent filling of the dual-damascene hole 258 by electrochemical plating (ECP).

Figure 24:
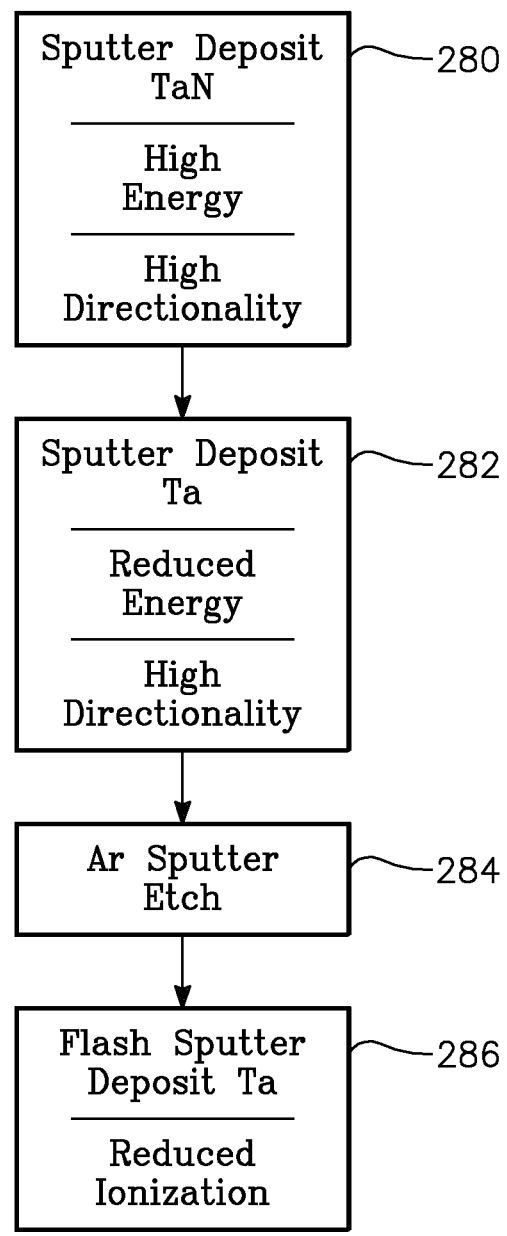
FIG. 24 is a flow chart illustrating a multi-step deposition and etch process of the invention.

A multi-step liner Ta/TaN liner process is illustrated in the flow diagram of FIG. 24. An example of precise process conditions are listed in TABLE I for a chamber configured for a 300 mm wafer but the listed values are illustrative only. The listed pressures are approximate since pressure is not actively controlled in the recipe.

TABLE 1

|  | TaN | Ta | Etch | Flash |
|---|---|---|---|---|
| Time (s) | 4 | 8.5 | 14 | 5 |
| DC Power (kW) | 15 | 15 | 0.5 | 5 |
| Bias Power (kW) | 0.8 | 0.4 | 1 | 0.4 |
| RF Coil Power (kW) | 0 | 0 | 1.25 | 0 |
| DC Coil Power (kW) | 0 | 0 | 0.5 | 0 |
| TIM Curr. (A) | 12 | 12 | 0 | 12 |
| TOM Curr. (A) | 0 | 0 | 0 | 0 |
| BIM Curr. (A) | −4.1 | −4.1 | 19 | −4.1 |
| BOM Curr. (A) | 0 | 0 | −19 | 0 |
| Ar (sccm) | 4 | 4 | 10 | 4 |
| $N_2$ (sccm) | 18 | 0 | 0 | 0 |
| Magnet Position | OUT | OUT | IN | OUT |
| Pressure (mTorr) | 0.5 | 0.9 | 0.9 | 0.9 |

After the wafer 32 has been inserted into the chamber 70 of FIG. 8, TaN is reactively sputter deposited on it under conditions that produce a high ionization fraction of tantalum ions and conditions of high wafer biasing such that a substantial portions of the tantalum sputter flux has high energy and is highly aniosotropic such that the energetic $Ta^+$ ions are attracted deep with the via hole. As a result, there is mixed sputter deposition of TaN and resputtering of this material. A ratio $N_2/Ar$ greater than one of reactive and sputtering gases flowing into the chamber causes the reactive sputter deposition of TaN on the wafer. The TaN resputtered by the energetic $Ta^+$ ion from the bottom of the via produces improved sidewall coverage within the via hole and reduces the thickness of the TaN layer at the bottom. Resputtering from the trench floor and the field region is not so effective, particularly since the trench floor and field region receive a sizable neutral tantalum flux, that is, un-ionized $Ta^0$. The high tantalum ionization fraction is achieved with a high target power and the strong but small LDR magnetron of FIG. 22 positioned in its outer position overlying the outer portions of the wafer. Target powers may range from 10 to 40 kW normalized to the area of a 300 mm wafer, but 15 kW seems to optimize the resputtering for this chamber and other processing values. During the TaN deposition only the two axially spaced inner electromagnets 74, 78 are powered in opposite senses to produce the opposed magnetic fields of FIG. 10, which act to confine the plasma and ion flux within the chamber away from the chamber sidewalls 36, thereby improving the radial uniformity of the ion flux. The two magnetic coil fields are intended to be nearly equal and the difference in the coil currents of TABLE 1 reflects a difference in the number of windings in the two coils.

In step 282, tantalum is sputter deposited onto the wafer 32 remaining in the chamber 70. Before this step, the nitrogen flow is stopped so the tantalum deposits in its elemental form. The tantalum sputter flux may be characterized as a maintained high directionality because of the maintained high target biasing in the presence of the small LDR magnetron but of reduced energy because the wafer biasing is reduced. The reduced energy reduces the resputtering at the via bottom, the trench floor, and the field region.

In step 284, the wafer 32 remains in the same chamber 70 but is subjected to sputter etching by argon ions by a plasma primarily sputtered by the RF power supplied from the RF coil. The RF power can vary from 1 to 3 kW with increased argon ion densities at the higher power. The etch rate peaks at about 1.5 to 2 kW. RF power of 1.25 kW seems optimal. The flow of argon into the chamber is increased, and the RF coil excites it into a plasma. The bias power applied to the wafer is increased to strongly attract the argon ions to thus etch the bottom of the via hole to remove any TaN there and to remove at least part of the Ta. The wafer bias power can be reduced but below about 500 W, the etch rate approaches zero. The target power and DC coil power can be adjusted to optimize the trench/via selectivity and uniformity. Generally the target power during the etch step is less than 10% of the target power during the two sputter deposition steps 280, 282. Tantalum resputtered by the argon ions from the via bottom improve the sidewall coverage. If the tantalum on the via bottom is completely removed, the argon sputter etch then cleans the underlying copper 254 which may have oxidized or otherwise been contaminated before the wafer 32 was inserted into the sputter chamber 70. Although tantalum exposed on the floor of the trench and in the field region is also etched, but the tantalum layer deposited in these regions in step 282 are thicker because of the neutral $Ta^0$ fraction in that step and hence the tantalum etched away from the via bottom before it is etched away on the trench floor and field region. Very little sidewall etching occurs because of the high wafer biasing. However, there is a potential problem of the tantalum being etched through (punched through) at the inside and outside corners of the trench.

Punch through is prevented by simultaneous performing a light, mostly neutral tantalum sputter deposition. Both the tantalum target and the RF coil (composed itself of tantalum) are biased with small values of negative DC power. To promote the DC sputtering of the coil, the two radially spaced bottom electromagnets 78, 80 are powered in opposite senses to produce a magnetic field distribution illustrated in FIG. 11, which creates a horizontal magnetic field on the inside surface of the coil 46, thus acting as a magnetron to increase the coil sputtering. The equal and generally opposed magnetic field produced by the outer electromagnetic coil 80 prevents a strong solenoidal magnetic field being created outside the chamber or in the center portions of the chamber processing area, where is would interfere with the transport of the argon ions.

During the sputter etch step 284, the magnetron has been moved to its inner position. In this position, the target center is cleaned, particularly of any nitride deposited on it during the step 280 of TaN sputter deposition. Further, since the small tantalum sputter flux during the sputter etch step 284 is mostly neutral, it is useful to have the magnetron at its more radially extending inner position illustrated in FIG. 22. However, in addition to the sputter etch step which also cleans the target, it is recommended that a distinct target cleaning step be periodically performed, for example, after 100 wafers are processed. An unillustrated grounded sputter shutter is closed to shield the pedestal from the target. The target is then sputtered with the magnetron sequentially placed in its out and inner positions. The target is strongly biased and sputtered for a longer time, for example, 10 s in the outer position and for a shorter time, for example, 1 s in its inner position.

It is recommended that during a movement of the magnetron the plasma be turned off, for example, by turning off the DC power to the target or RF power to the coil and then moving the magnetron by changing the magnetron rotation speed. Then, the plasma is reignited, typically using a higher argon flow and a higher target or coil power than in the subsequent processing step. The recipe of TABLE 1 does not include power ramp periods before plasma ignition, which are well known in the art.

In step 286, tantalum is sputter deposited in a flash layer with a reduced tantalum ionization fraction. The flash step assures a continuous tantalum layer 268 in the field region, the trench floor, and at the corners of the trench. The deposition conditions are generally the same as in the primary tantalum deposition step except the target power is reduced by at least a factor of two. As a result, the tantalum ionization fraction is reduced. As a result, the tantalum flux is more neutral and more isotropic, thereby assuring high field coverage and reasonable trench floor coverage. Preferably, the magnetron is located at its outer position during the Ta flash step 286.

At the completion of the liner steps of FIG. 24 and the formation of the liner structure of FIG. 23, the wafer is removed from the tantalum sputter reactor. Typically, a conformal thin copper seed layer is sputtered onto the remaining Ta layer 268 and onto the copper contact 254 exposed at the bottom of the via hole 260. The via hole 260 and trench 262 are then filled and overfilled with copper in an ECP process. It is understood that copper in both the copper seed layer and the ECP fill may contain up to 10 wt % of other elements. The excess ECP copper remaining above the trench 262 is removed by CMP.

Many aspects of the invention are not limited to the illustrated tantalum sputter reactor or to the described Ta/TaN liner process. Other types of sputter reactors and other target compositions benefit from the invention, for example, other refractory metals such as titanium, tungsten and ruthenium. Further, magnetic steering and plasma and ion confinement incorporating the invention can be used in other plasma processing reactors. Such reactors include plasma etch reactors, including sputter etchers, and plasma CVD reactors.

The reactor of the invention provides great flexibility and high performance. It further allows a complex multi-step process, such as the described Ta(N) barrier formed in vias of reduced size expected in future generations of integrated circuits.

The invention claimed is:

1. In a plasma sputter reactor having a substrate support disposed in a plane perpendicular to an axis of a vacuum chamber having sidewalls formed around the axis and a sputter target arranged in opposition to the substrate support across a space along the axis, an electromagnet array of four electromagnet coils arranged at axial positions relative to the axis between the sputter target and the substrate support and all being configured to be connected to at least one DC power supply, wherein three electromagnet coils of the four electromagnet coils are arranged about the axis in a triangular array, wherein at least two of the three electromagnet coils are disposed at different radii from the axis and at least two of the three electromagnet coils are disposed at different axial positions relative to the axis, and wherein no more than two of the four electromagnet coils are disposed at a same radius from the axis and no more than two of the four electromagnet coils are disposed at a same axial position relative to the axis.

2. The electromagnet array of claim 1, wherein the four electromagnet coils are arranged in a rectangular array about the axis.

3. A method of operating the plasma sputter reactor of claim 1, comprising the steps of:

a first process step of generating a first plasma in the reactor while a substrate disposed on the substrate support including passing co-rotating currents through two of the three electromagnet coils arranged about the axis in the triangular array, and a second process step of generating a second plasma in the reactor while the substrate is disposed on the substrate support including passing anti-rotating currents through the two electromagnet coils.

4. The method of claim 3, wherein one of the first and second process steps includes sputtering material from the target onto the substrate and the other of the first and second process steps includes etching the substrate with argon ions.

5. A plasma sputter reactor having a substrate support disposed in a plane perpendicular to an axis of a vacuum chamber having sidewalls formed around the axis and a sputter target arranged in opposition to the substrate support across a space along the axis, an electromagnet array comprising four electromagnet coils including three separately controllable electromagnet coils arranged in a triangular away about the axis at a plurality of axial positions relative to the axis between the sputter target and the substrate support and at a plurality of axial positions relative to the axis between the sputter target and the substrate support and at a plurality of radii from the axis and all of the four electromagnet coils being configured to be connected to at least one DC power supply, wherein no more than two of the four electromagnet coils are disposed at a same radius from the axis and no more than two of the four electromagnet coils are disposed at a same axial position relative to the axis.

6. The plasma sputter reactor of claim 5, wherein the four electromagnet coils are disposed at axial positions relative to the axis extending no farther than an axial extent of the axis and further comprising an RF coil wrapped around the axis inside the sidewalls and disposed within the axial extent along the axis.

* * * * *